(12) United States Patent
Bai et al.

(10) Patent No.: US 9,589,928 B2
(45) Date of Patent: Mar. 7, 2017

(54) COMBINED QFN AND QFP SEMICONDUCTOR PACKAGE

(71) Applicants: Zhigang Bai, Tianjin (CN); Jinzhong Yao, Tianjin (CN); Lan Chu Tan, Singapore (SG)

(72) Inventors: Zhigang Bai, Tianjin (CN); Jinzhong Yao, Tianjin (CN); Lan Chu Tan, Singapore (SG)

(73) Assignee: NXP USA, INC., Austin, TX (US)

( * ) Notice: Subject to any disclaimer, the term of this patent is extended or adjusted under 35 U.S.C. 154(b) by 45 days.

(21) Appl. No.: 14/552,497

(22) Filed: Nov. 25, 2014

(65) Prior Publication Data

US 2015/0294924 A1 Oct. 15, 2015

(30) Foreign Application Priority Data

Apr. 15, 2014 (CN) .......................... 2014 1 0199269

(51) Int. Cl.
*H01L 23/48* (2006.01)
*H01L 23/00* (2006.01)
(Continued)

(52) U.S. Cl.
CPC ........ *H01L 24/85* (2013.01); *H01L 23/49537* (2013.01); *H01L 23/49541* (2013.01); *H01L 23/49548* (2013.01); *H01L 23/49551* (2013.01); *H01L 23/49861* (2013.01); *H01L 21/565* (2013.01); *H01L 23/3121* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/05599* (2013.01); *H01L 2224/2919* (2013.01); *H01L 2224/29339* (2013.01); *H01L 2224/32245* (2013.01); *H01L 2224/456* (2013.01); *H01L 2224/4569* (2013.01); *H01L 2224/45144* (2013.01); *H01L 2224/45147* (2013.01); *H01L 2224/45565* (2013.01); *H01L 2224/48091* (2013.01); *H01L 2224/48247* (2013.01); *H01L 2224/49109* (2013.01); *H01L 2224/73265* (2013.01);
(Continued)

(58) Field of Classification Search
CPC ..... H01L 2224/73265; H01L 2924/181; H01L 2224/49171; H01L 2924/19107; H01L 23/49503

See application file for complete search history.

(56) References Cited

U.S. PATENT DOCUMENTS 6,459,148 B1  10/2002  Chun-Jen et al.
6,818,973 B1  11/2004  Foster
(Continued)

*Primary Examiner* — Eva Y Montalvo
*Assistant Examiner* — David Goodwin

(57) ABSTRACT

A semiconductor package includes a first lead frame type having a first type of package leads and a pre-molded portion, and a second lead frame type having a second type of package leads that surround a die pad and are supported by the pre-molded portion. An integrated circuit is attached to the die pad and electrically connected to the first and second types of leads with bond wires. A mold compound, which forms a mold cap, covers the first and second lead frame types, the integrated circuit and the bond wires. The first lead frame type may be a QFP type and the second lead frame type may be a QFN type.

19 Claims, 10 Drawing Sheets

(51) Int. Cl.
*H01L 23/495* (2006.01)
*H01L 23/498* (2006.01)
H01L 21/56 (2006.01)
H01L 23/31 (2006.01)

(52) U.S. Cl.
CPC ............... *H01L 2224/85399* (2013.01); *H01L 2224/92247* (2013.01); *H01L 2924/00014* (2013.01); *H01L 2924/14* (2013.01); *H01L 2924/1433* (2013.01); *H01L 2924/1434* (2013.01); *H01L 2924/181* (2013.01)

(56) References Cited

U.S. PATENT DOCUMENTS

| | | | |
|---|---|---|---|
| 7,960,815 B2 | 6/2011 | Camacho et al. | |
| 8,673,687 B1* | 3/2014 | Liu | H01L 23/49503 257/670 |
| 2003/0227076 A1* | 12/2003 | Sugimori | H01L 23/3107 257/670 |
| 2004/0262752 A1* | 12/2004 | Ito | H01L 23/3107 257/734 |
| 2005/0051877 A1* | 3/2005 | Hsu | H01L 21/4821 257/667 |
| 2005/0098860 A1* | 5/2005 | Lai | H01L 23/3107 257/666 |
| 2005/0189627 A1* | 9/2005 | Ito | H01L 21/4825 257/666 |
| 2007/0018291 A1* | 1/2007 | Huang | H01L 21/4821 257/676 |
| 2008/0036051 A1* | 2/2008 | Espiritu | H01L 23/3135 257/666 |
| 2009/0072366 A1* | 3/2009 | Badakere Govindaiah | H01L 23/495 257/676 |
| 2014/0302640 A1* | 10/2014 | Qin | H01L 23/49582 438/108 |

* cited by examiner

COMBINED QFN AND QFP SEMICONDUCTOR PACKAGE

BACKGROUND OF THE DISCLOSURE

The present invention is directed to semiconductor packaging and, more particularly, to a combined QFN (Quad Flat No-Lead) and QFP (Quad Flat Package) semiconductor package.

There are various kinds of packages available for semiconductor devices. One common package type is known as a QFN or Quad Flat No-Leads package. In this package type, which is lead frame based, the exposed device contacts are flush with the bottom and side edges of the package housing. Another common lead frame based package type is a QFP or Quad Flat Package. In this package type, the leads project from the sides of the package housing.

It would be advantageous to have a semiconductor package that combines QFN and QFP leads in order to provide a semiconductor device with additional inputs/outputs.

BRIEF DESCRIPTION OF THE DRAWINGS

The present invention is illustrated as an example and is not limited by embodiments thereof shown in the accompanying figures, in which like references indicate similar elements. Elements in the figures are illustrated for simplicity and clarity and have not necessarily been drawn to scale.

DETAILED DESCRIPTION

Figure 1A:
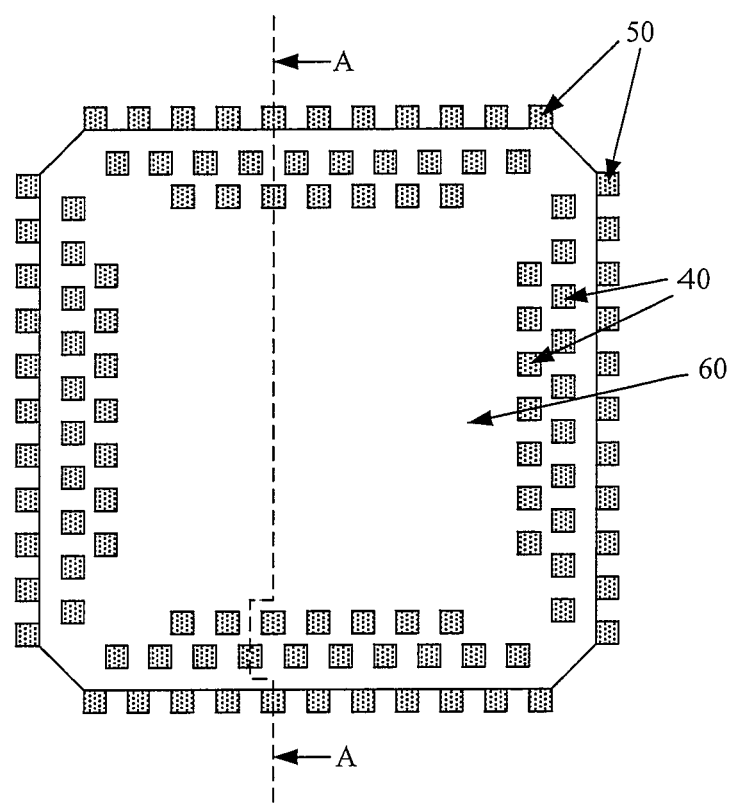
FIG. 1A is a bottom plan view of a semiconductor package according to an embodiment of the present invention.

Detailed description of the appended drawings is intended as description of the currently preferred embodiments of the present invention, and is not intended to represent the only forms in which the present invention may be practiced. It is to be understood that the same or equivalent functions may be accomplished by different embodiments intended to be encompassed within the spirit and scope of the present invention.

In one embodiment, the present invention provides a semiconductor package including a die pad, an integrated circuit, a plurality of first package type leads, a plurality of second package type leads, and a mold cap. The die pad has an upper surface and a lower surface, and the integrated circuit is attached on the upper surface of the die pad. The first package type leads surround the die pad and are electrically connected to the integrated circuit with first bond wires. The second package type leads are positioned above the first package type leads and are electrically connected to the integrated circuit with second bond wires. The second package type is different from the first package type. The mold cap at least partially covers the die pad, the integrated circuit, the first and second package type leads, and the first and second bond wires.

In another embodiment, the present invention provides a method of assembling a semiconductor package. The method includes providing a pre-molded assembly comprising a first package type lead frame, and positioning a second package type lead frame above the pre-molded assembly. The pre-molded assembly includes a first package type lead frame having a plurality of first package type leads, and a pre-molded portion for positioning the first package type leads. The first package type is different from the second package type. The second package type lead frame includes a die pad and a plurality of second package type leads surrounding the die pad. The second package type leads are supported by the pre-molded portion. The method further includes attaching an integrated circuit on an upper surface of the die pad, electrically connecting the first package type leads to the integrated circuit with first bond wires, electrically connecting the second package type leads to the integrated circuit with second bond wires, and forming a mold cap that at least partially covers the pre-molded assembly, the second package type lead frame, the integrated circuit, and the first and second bond wires.

The foregoing has outlined rather broadly the features and technical advantages of the present invention so the detailed description of the invention that follows may be better understood. Additional features and advantages of the invention will be described hereinafter, which form the subject of the claims of the invention. It should be appreciated by those skilled in the art that the conception and specific embodiments disclosed may be readily used as a basis for modifying or designing other structures or processes for carrying out the same purposes of the present invention. It should also be realized by those skilled in the art that such equivalent constructions do not depart from the spirit and scope of the invention as set forth in the appended claims.

Figure 1B:
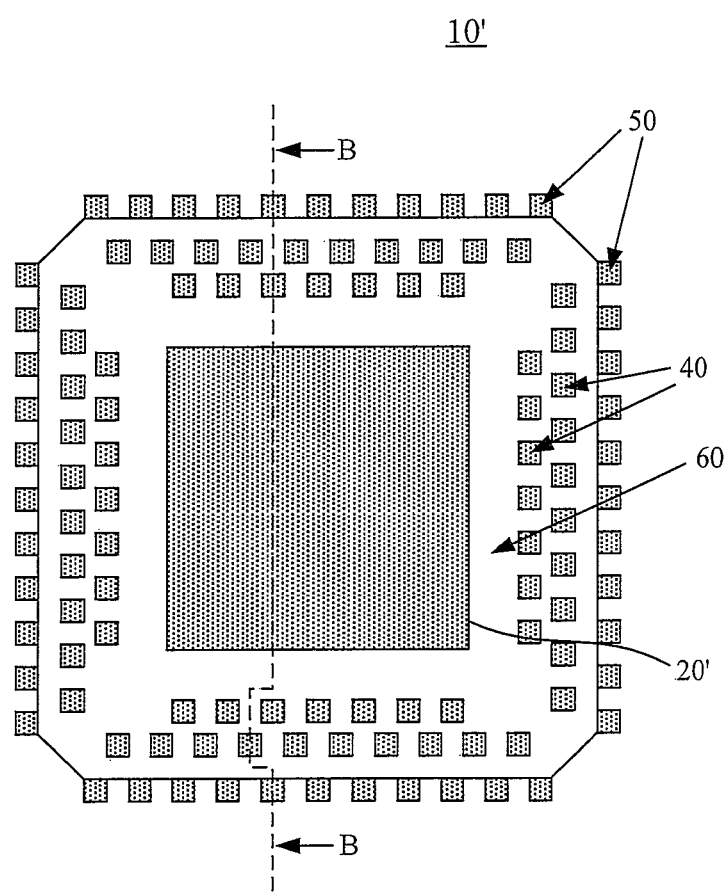
FIG. 1B is a bottom view of a semiconductor package according to an embodiment of the present invention.
Figure 2A:
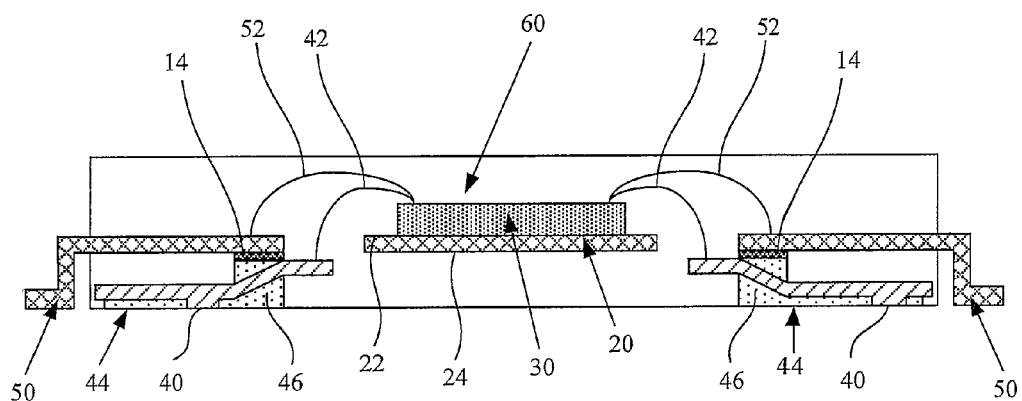
FIG. 2A is a cross-sectional side view of the semiconductor package of FIG. 1A along line A-A.
Figure 2B:
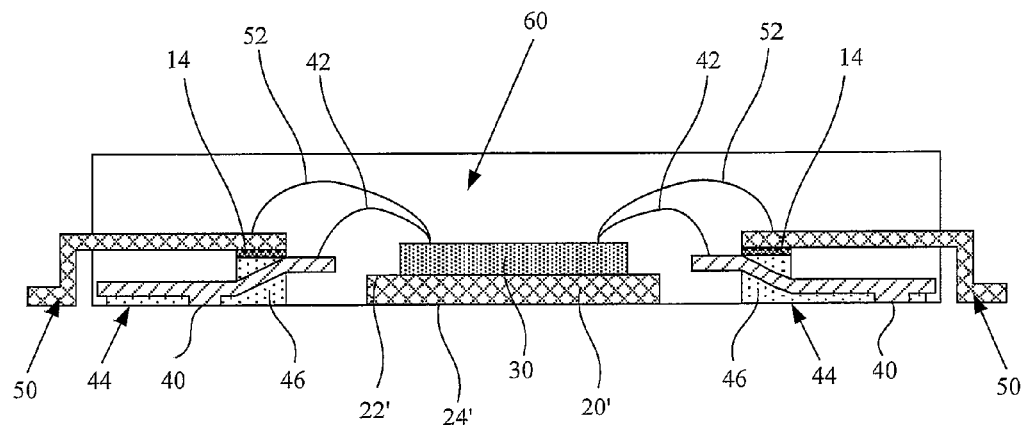
FIG. 2B is a cross-sectional side view of the semiconductor package of FIG. 1B along line B-B.

FIG. 1A is a bottom view of a semiconductor package 10 according to an embodiment of the present invention, and FIG. 2A is a cross-sectional side view of the semiconductor package 10 of FIG. 1A along line A-A. The semiconductor package 10 is a combination of a QFN package and a QFP package. In the embodiment shown, the semiconductor package 10 is a non-exposed pad (EP) type package. However, as will be apparent to those skilled in the art, the present invention may also have an exposed pad, as shown in FIG. 1B and FIG. 2B. FIG. 1B is a bottom view of a semiconductor package 10' according to an embodiment of the present invention having an exposed die pad 20', and FIG. 2B is a cross-sectional side view of the semiconductor package 10' of FIG. 1B along line B-B.

As shown in FIGS. 1A and 2A, the semiconductor package 10 includes a die pad 20, an integrated circuit 30, a plurality of first package type leads 40, a plurality of second package type leads 50, and a mold cap or package body 60. In the presently preferred embodiment, the first package type is a QFN package, i.e., the first package type leads 40 are QFN leads, and the second package type is a QFP package, i.e., the second package type leads 50 are QFP leads.

In one embodiment, the die pad 20 is formed together with the QFP leads 50, and has an upper surface 22 and a lower surface 24. The integrated circuit 30 is attached on the upper surface 22 of the die pad 20 with a die attach adhesive or an Ag paste, as is known in the art. The integrated circuit 30 may be any type of integrated circuit, such a processor, a controller, a memory, or System On a Chip (SOC), or an Application Specific Integrated Circuit (ASIC).

The QFN leads 40 are arranged to surround the die pad 20. The QFN leads 40 are electrically connected to the electrodes or die bonding pads of the integrated circuit 30 with first bond wires 42. The QFP leads 50 have first or proximal ends (proximate to the integrated circuit) that are positioned above and supported by the QFN leads 40, as will be described in more detail below, intermediate portions that project from the mold cap 60, and distal ends that are outside of the mold cap 60 and lie in the same plane as the QFN leads 40. Although the QFP leads 50 shown in FIG. 2 have a sharp (90°) bend so that the distal ends lie in the same plane as the QFN leads 40, it will be understood by those of skill in the art that this bend could be less than 90°.

The proximal ends of the QFP leads 50 are positioned above and supported by the QFN leads 40. The QFP leads 50 preferably are secured to the QFN leads 40, as will be described in greater detail, with an adhesive 14. The adhesive 14 may comprise a die attach film, epoxy resin, or tape. Each QFP lead 50 is electrically connected to the integrated circuit 30 with a second bond wire 52. The first and second bond wires 42, 52 may comprise bare wires such as gold or copper wires, plated wires, insulated wires or combinations thereof. The method of attaching the bond wires 42, 52 to the integrated circuit 30 and the leads 40, 50 are well known to those of skill in the art using commercially available wire bonding equipment.

As shown, the QFN leads 40 are exposed at the bottom of the package 10 and the QFP leads 50 project out of the sides of the mold cap 60. The QFN leads 40 and the QFP leads 50 respectively provide electrical connections between the integrated circuit 30 and an external device (not shown), e.g., a circuit board upon which the semiconductor package 10 is mounted. The mold cap 60 covers the die pad 20, the integrated circuit 30, the first and second bond wires 42 and 52, and portions of the QFN and QFP leads.

To assemble the semiconductor package 10, a pre-molded assembly 44 (FIG. 2A) is first formed. The pre-molded assembly 44 includes the QFN leads 40 and a pre-molded portion 46 (shown in FIGS. 5-8) for positioning the QFN leads 40.

Figure 3:
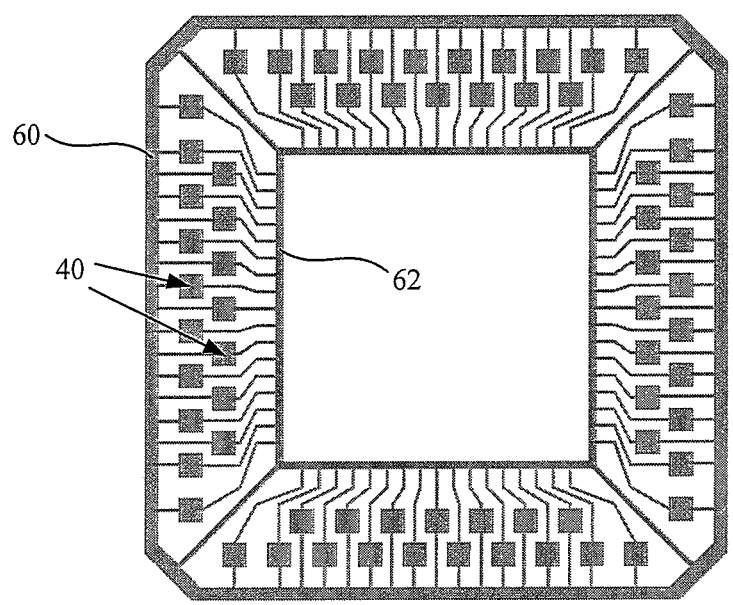
FIG. 3 is a top plan view of a QFN lead frame according to an embodiment of the present invention.
Figure 10:
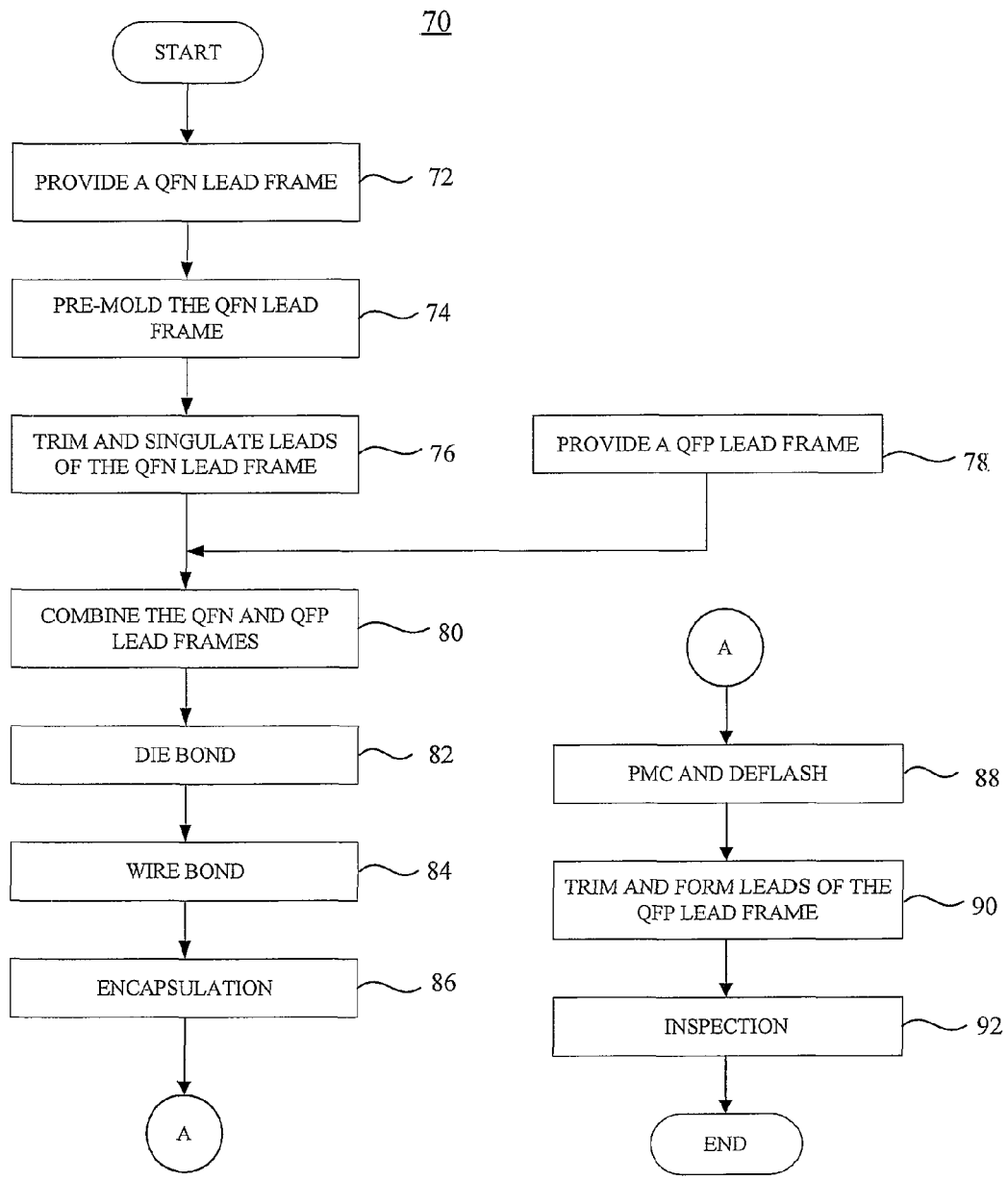
FIG. 10 is a flow chart of a method of assembling a combined QFN and QFP package according to an embodiment of the present invention.

FIG. 10 is a flow chart illustrating a method of assembling the semiconductor package 10 according to an embodiment of the present invention. The process of assembling the pre-molded assembly 44 and the semiconductor package 10 will now be discussed with reference to FIGS. 3-5 and 10. The method 70 starts at step 72 by providing a QFN lead frame 48. FIG. 3 is a top view of the QFN lead frame 48 including the QFN leads 40 according to an embodiment of the present invention. The QFN leads are connected by an outer connection bar 60 and an inner connection bar 62.

Figure 4A:
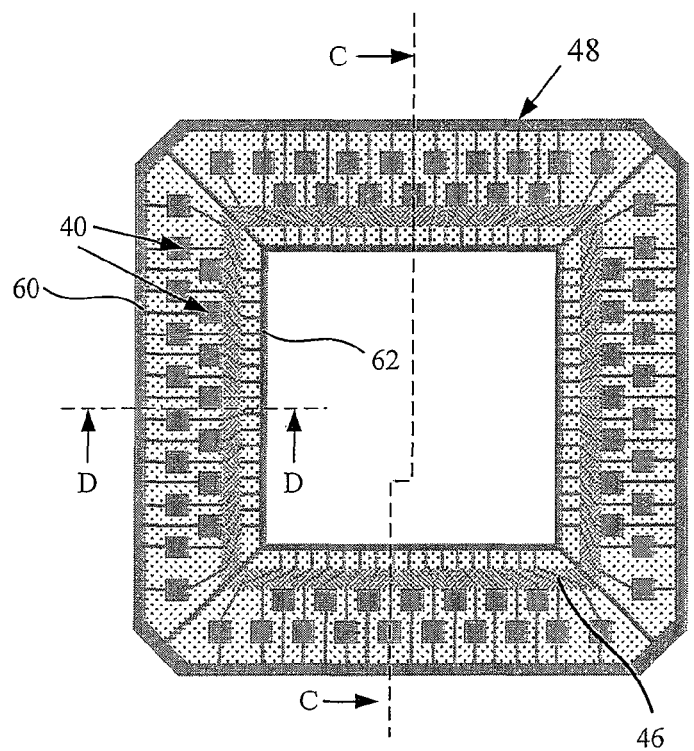
FIG. 4A is a top view of the QFN lead frame shown in FIG. 3 after undergoing a pre-molding process.
Figure 4B:
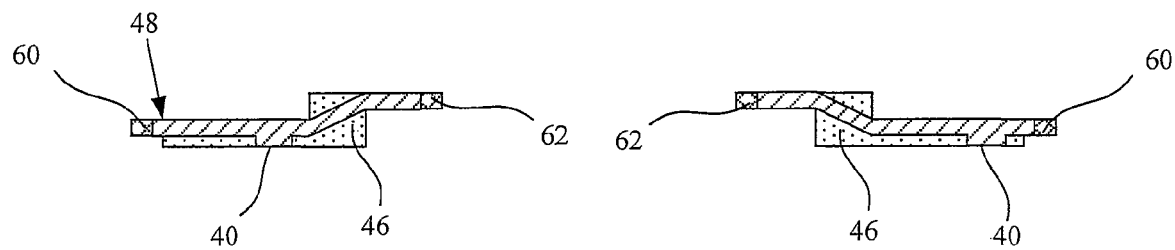
FIG. 4B is a cross-sectional side view of the pre-molded QFN lead frame of FIG. 4A along line C-C.
Figure 4C:
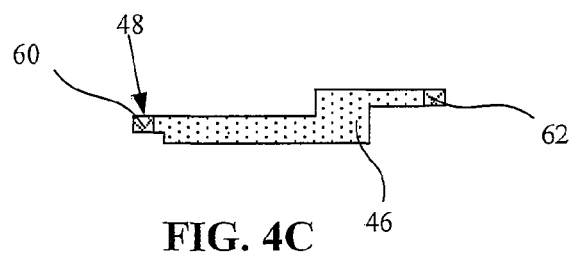
FIG. 4C is a cross-sectional side view of part of the pre-molded QFN lead frame of FIG. 4A along line D-D.

At step 74, the QFN lead frame 48 is pre-molded. FIG. 4A is a top view of the pre-molded QFN lead frame 48 shown in FIG. 3, having a pre-molded portion 46. FIG. 4B is a cross-sectional side view of the pre-molded QFN lead frame 48 of FIG. 4A along line C-C, and FIG. 4C is a cross-sectional side view of part of the pre-molded QFN lead frame 48 of FIG. 4A along line D-D. In a preferred embodiment, a thickness of portions of the pre-molded portion 46 proximal to the outer connection bar 60 or inner connection bar 62 is the same as a thickness of the outer and inner connection bars 60 and 62 so that the pre-molded QFN lead frame 48 can be clamped for punching the outer and inner connection bars 60 and 62.

Figure 5A:
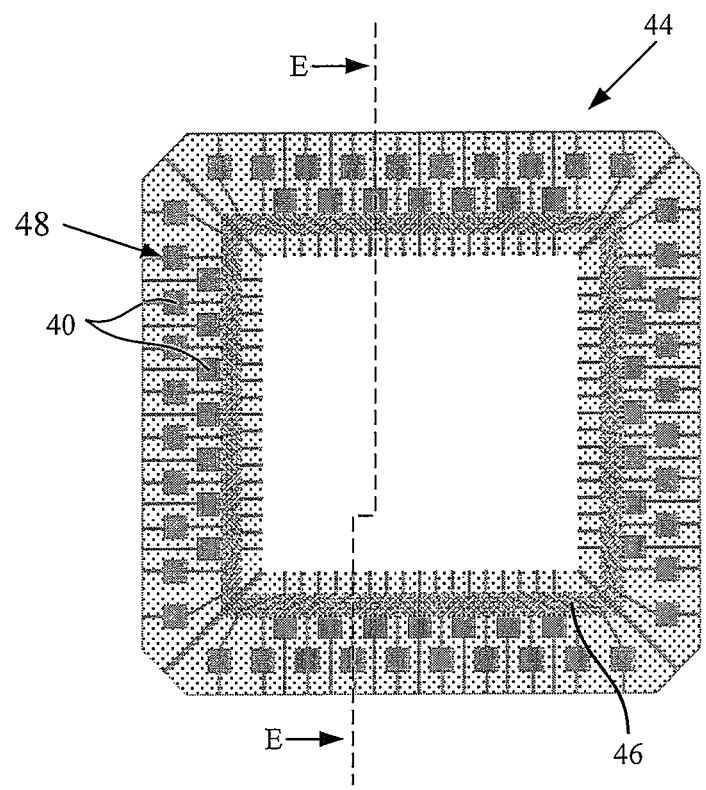
FIG. 5A is a top view of a pre-molded assembly according to an embodiment of the present invention.
Figure 5B:
FIG. 5B is a cross-sectional side view of the pre-molded assembly of FIG. 5A along line E-E.

At step 76, the pre-molded QFN lead frame is trimmed and the QFN leads 40 are isolated to form the pre-molded assembly 44 by punching the outer and inner connections bars 60 and 62. FIG. 5A is a top view of the pre-molded assembly 44 according to an embodiment of the present invention, and FIG. 5B is a cross-sectional side view of the pre-molded assembly of FIG. 5A along line E-E, in which the pre-molded assembly 44 is formed by punching the molded QFN lead frame 48 in FIG. 4A to isolate all of the leads.

The QFN lead frame 48 is formed in a way similar to a conventional QFN lead frame in that the QFN lead frame 48 includes a plurality of QFN type leads 40 arranged in one or more rows (two are shown) around a central opening. In the embodiment shown, the QFN lead frame 48 does not include a die pad, just a central opening.

The QFN lead frame 48 is pre-molded to hold the QFN leads 40 in place. The material used to pre-mold the lead frame 48 may comprise any commercially available plastic or encapsulant materials or a tape may be used.

After the QFN leads 40 are secured in place with the first mold material, the lead frame 48 is trimmed to isolate the QFN leads 40. The trimming may comprise punching off unnecessary parts of the lead frame 48 and pre-molded portion 46. Thus, the pre-molded assembly 44 is formed. Although the drawings show a single lead frame, as will be understood by those skilled in the art, the lead frame 48 or pre-molded assembly 44 may be provided in either a strip or array form so that multiple pre-molded QFN lead frames may be simultaneously assembled.

Figure 6:
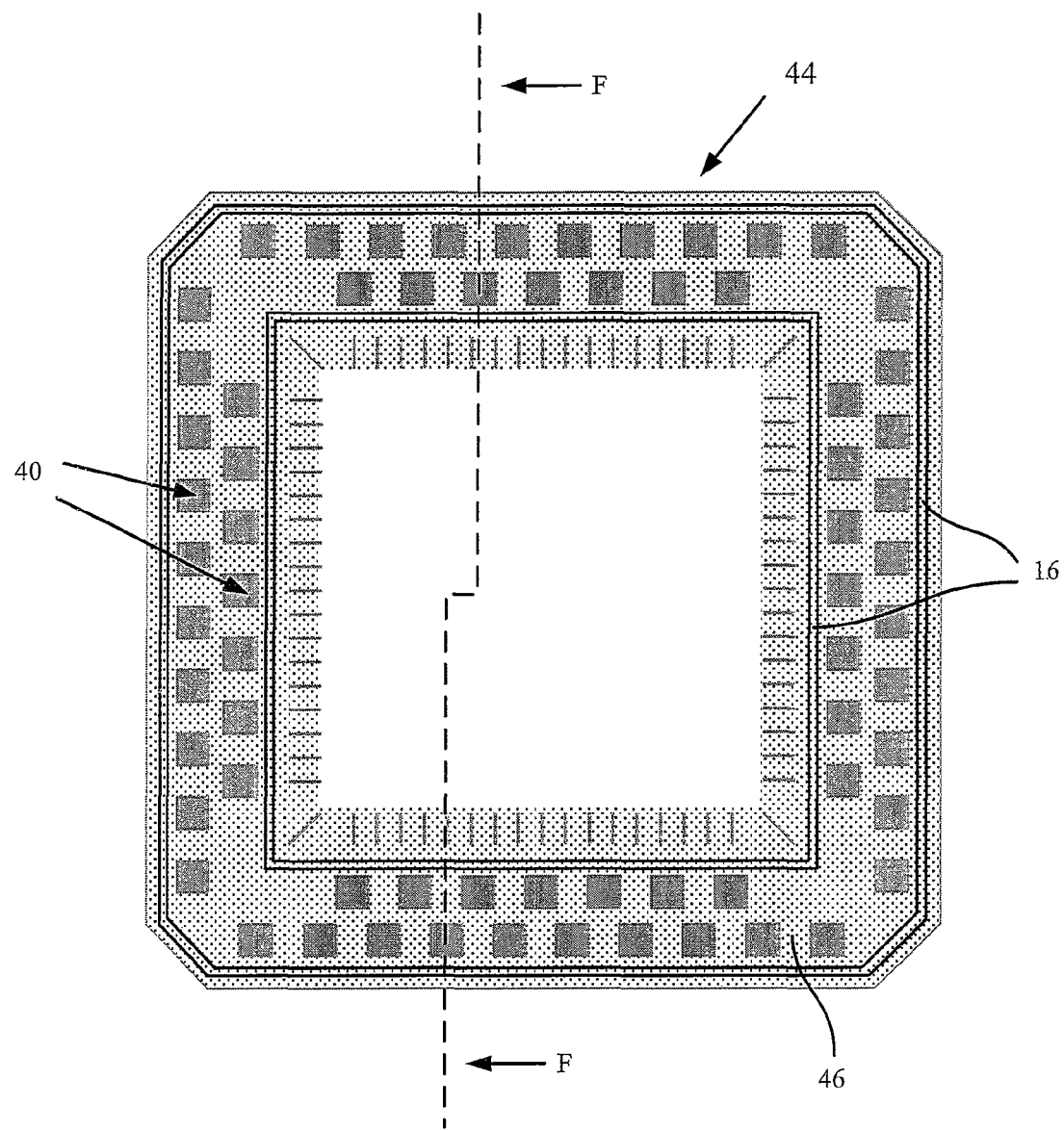
FIG. 6 is a bottom plan view of the pre-molded assembly having at least one resin bleeding slot according to one embodiment of the present invention.

FIG. 6 is a bottom view of the pre-molded assembly 44 according to one embodiment of the present invention. In this embodiment, the pre-molded assembly 44 includes at least one resin bleed slot 16 formed on the bottom of the pre-molded assembly 44 to prevent resin bleeding onto the QFN leads 40. The resin bleed slot 16 can be formed with a mold chase during pre-molding, or by etching the pre-molded portion 46 after pre-molding.

Figure 7:
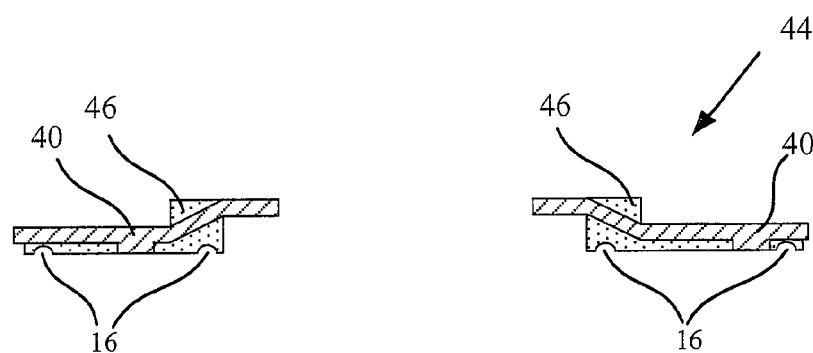
FIG. 7 is a cross-sectional side view of the pre-molded assembly of FIG. 6 along line F-F.

FIG. 7 is a cross-sectional side view of the pre-molded assembly 44 along line F-F of FIG. 6. As shown in FIGS. 6 and 7, one resin bleed slot 16 is provided around the QFN leads 40 in the outer side of the QFN lead frame 48, and another resin bleed slot 16 is provided around the QFN leads 40 in the inner side of the QFN lead frame 48. In the following molding process, the resin bleed slots 16 protect the QFN leads 40 from being covered by mold compound.

Figure 8:
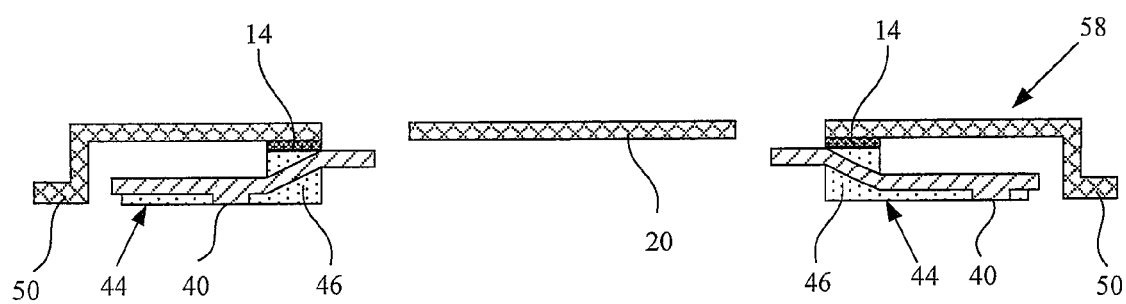
FIG. 8 is a cross-sectional side view of a combination of the pre-molded QFN assembly and a QFP lead frame including a die pad and leads.

At step 78, a QFP lead frame is provided, and at step 80, the QFP lead frame is attached to the pre-molded assembly 44. FIG. 8 is a cross-sectional side view of a combination of the pre-molded assembly 44 and a QFP lead frame 58 including the die pad 20 and the QFP leads 50. The QFP lead frame 58 generally comprises a conventional QFP lead frame except that it is sized and shaped to mate with the pre-molded assembly 44. The QFP lead frame 58 is positioned above the pre-molded assembly 44 and secured thereto with the adhesive 14 such that the QFP leads 50 are supported by the pre-molded portion 46.

Once the two lead frames (QFN and QFP) are mated, the remaining process steps are somewhat conventional and include, die bonding, wire bonding, encapsulation, post mold cure (PMC), de-flash, trim and form, and inspection, as shown at steps 82-92 in FIG. 10. Persons skilled in the art are familiar with the process, and thus detailed description of these steps is not necessary for a complete understanding of the invention. However, according to an embodiment of the present invention, a de-flashing step may be performed after molding the combination of the pre-molded assembly 44 and a QFP lead frame 58 to provide additional electrical connections.

Figure 9:
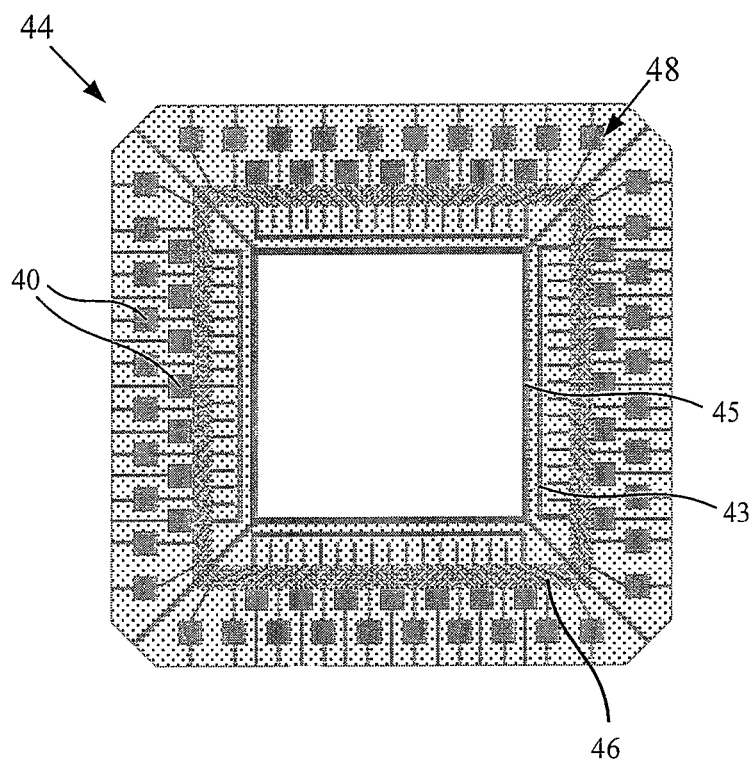
FIG. 9 is a top plan view of a pre-molded assembly with power and ground bars according to one embodiment of the present invention.

Thus, the present invention combines QFN and QFP packages together to provide a package having an increased number of leads, while not increasing the size (i.e., foot print) of the semiconductor package 10. For example, for a current 14×14 65 um pitch QFP, the present invention can have 140 QFN leads and 80 QFP leads. If necessary, a power ring and/or a ground ring may be added when preparing the corresponding QFN lead frame. FIG. 9 is a top plan view of the pre-molded assembly 44 according to one embodiment of the present application, where the pre-molded QFN lead frame 48 is punched to isolate the leads 40. As shown in FIG. 9, the QFN lead frame 48 includes both a power ring 43 and ground ring 45.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the present invention, as described in the claims.

What is claimed is:

1. A semiconductor package, comprising:
   a die pad having an upper surface and a lower surface;
   an integrated circuit attached on the upper surface of the die pad;
   a plurality of first package type leads surrounding the die pad, wherein each of the plurality of first package type leads is electrically connected to the integrated circuit with first bond wires;
   a plurality of second package type leads that surround the first package type leads, wherein the second package type leads have proximal ends that are positioned above the plurality of first package type leads, wherein the proximal ends of the second package type leads are electrically connected to the integrated circuit with second bond wires, and wherein the second package type leads are of a different lead type than the first package type leads; and
   a mold cap that at least partially covers the die pad, the integrated circuit, the plurality of first and second package type leads, and the first and second bond wires;
   a pre-molded portion for positioning the first package type leads and supporting the second package type leads over the first package type leads, wherein the pre-molded portion includes a structure located between leads of the plurality of first package type leads and leads of the plurality of second package type leads in a direction orthogonal to the upper surface of the die pad, wherein the structure is formed separately from the mold cap.

2. The semiconductor package of claim 1, wherein the second package type leads have intermediate portions that project from sides of the mold cap and distal ends that lie in a parallel plane with the first package type leads.

3. The semiconductor package of claim 2, wherein a lower surface of the die pad not covered by the mold cap is exposed.

4. The semiconductor package of claim 2, wherein a lower surface of the die pad is covered by the mold cap.

5. The semiconductor package of claim 1, wherein the plurality of the first package type leads are of a lead type for a quad flat non-leaded package (QFN) and the plurality of the second package type leads are of a lead type for a quad flat package (QFP).

6. The semiconductor package of claim 1, further comprising a ground ring surrounded by the first package type leads and electrically coupled to the integrated circuit.

7. The semiconductor package of claim 1, further comprising a power ring surrounded by the first package type leads and electrically coupled to the integrated circuit.

8. The semiconductor package of claim 1, wherein the second package type leads are attached to the pre-molded portion with adhesive.

9. The semiconductor package of claim 1, further comprising an adhesive attaching leads of the plurality of second package type leads to the structure of the pre-molded portion.

10. The semiconductor package of claim 1, wherein the structure includes a plastic material.

11. The semiconductor package of claim 1, wherein the structure includes an encapsulant material.

12. The semiconductor package of claim 1, wherein the structure includes tape.

13. The semiconductor package of claim 1 wherein at least a portion of each lead of the plurality of first package type leads is encapsulated in the pre-molded portion.

14. The semiconductor package of claim 1 wherein a lower portion of the pre-molded portion not covered by the mold cap is exposed.

15. The semiconductor package of claim 1 wherein the pre-molded portion includes an opening, wherein the die pad is located in an area of the opening.

16. A semiconductor package, comprising:
   a die pad having an upper surface and a lower surface;
   an integrated circuit attached on the upper surface of the die pad;
   a pre-molded assembly comprising a plurality of first package type leads and mold material, wherein at least a portion of each lead of the plurality of first package type leads is encapsulated in the mold material, wherein each of the plurality of first package type leads is electrically connected to the integrated circuit with first bond wires;
   a plurality of second package type leads, wherein the second package type leads have proximal ends that are positioned above the plurality of first package type leads, wherein the proximal ends of the second package type leads are electrically connected to the integrated circuit with second bond wires, and wherein the second package type leads are of a different lead type than the first package type leads; and
   a mold cap that at least partially covers the die pad, the integrated circuit, the plurality of second package type leads, the pre-molded assembly, and the first and second bond wires, wherein the mold cap and the mold material are separately formed;

wherein mold material of the pre-molded assembly is located between leads of the plurality of first package type leads and leads of the plurality of second package type leads in a direction orthogonal to the upper surface of the die pad.

17. The semiconductor package of claim 16, wherein the second package type leads are attached to the pre-molded assembly with adhesive.

18. The semiconductor package of claim 16 wherein the pre-molded assembly includes an opening, wherein the die pad is located in an area of the opening.

19. A semiconductor package, comprising:
- a die pad having an upper surface and a lower surface;
- an integrated circuit attached on the upper surface of the die pad;
- a pre-molded assembly comprising a plurality of first package type leads surrounding the die pad, wherein each of the plurality of first package type leads is electrically connected to the integrated circuit with first bond wires;
- a plurality of second package type leads that surround the first package type leads, wherein the second package type leads have proximal ends that are positioned above the plurality of first package type leads, wherein the proximal ends of the second package type leads are electrically connected to the integrated circuit with second bond wires, and wherein the second package type leads are of a different lead type than the first package type leads; and
- a mold cap that at least partially covers the die pad, the integrated circuit, the plurality of second package type leads, the pre-molded assembly, and the first and second bond wires;

wherein a structure of the pre-molded assembly is located between leads of the plurality of first package type leads and leads of the plurality of second package type leads in a direction orthogonal to the upper surface of the die pad, wherein the structure is of a material different than a material of the mold cap.

* * * * *